United States Patent [19]

Koyama et al.

[11] Patent Number: 5,006,818
[45] Date of Patent: Apr. 9, 1991

[54] LINEAR DIFFERENTIAL AMPLIFIER

[75] Inventors: Mikio Koyama, Yokohama; Hiroshi Tanimoto, Kawasaki, both of Japan

[73] Assignee: Kabushiki Kaisha Toshiba, Kawasaki, Japan

[21] Appl. No.: 500,044

[22] Filed: Mar. 27, 1990

Related U.S. Application Data

[63] Continuation-in-part of Ser. No. 253,577, Oct. 5, 1988, abandoned.

[30] Foreign Application Priority Data

Oct. 12, 1987 [JP] Japan .................................. 62-254783

[51] Int. Cl.[5] .............................................. H03F 3/45
[52] U.S. Cl. .................................................. 330/261
[58] Field of Search ................................ 330/252, 261

[56] References Cited

U.S. PATENT DOCUMENTS 4,146,844 3/1979 Quinn .................................... 330/149
4,379,268 4/1983 Nagata ............................. 330/257 X
4,516,081 5/1985 Katakura ........................ 330/257 X

FOREIGN PATENT DOCUMENTS 3027071 2/1982 Fed. Rep. of Germany ...... 330/261

OTHER PUBLICATIONS

Melis et al., "Voltage-Controlled Gain in the Audio Channel", *Journal of the Audio Engineering Society*, vol. 20, No. 3, Oct. 1972, p. 63.

Voorman et al., "Bipolar Integration of Analog Grator and Laguerre Type Filters (Transconductor-Capacitor Filters)", Proc. ECCTD '83 Stuttgart, pp. 108-110.

*Primary Examiner*—James B. Mullins
*Attorney, Agent, or Firm*—Foley & Lardner

[57] ABSTRACT

A differential amplifier with improved linearity. The amplifier includes a circuit comprised of two emitter-coupled pairs, each pair being formed by two transistors, with connections between corresponding collectors, and constant voltage sources for producing offsets between corresponding bases of the emitter-coupled pairs. The improved linearity is achieved by obtaining outputs as sums of collector currents with offsets. The emitter areas of the transistors can be of the minimum size available. This feature, when combined with the use of emitter-followers as the constant voltage sources, enable the differential amplifier to achieve a high S/N ratio, a good high-frequency characteristic, a high direct current gain, and a high-speed operation capability along with the improved linearity. In addition, the linearity is further improved by using additional diodes connected to the transistors.

11 Claims, 10 Drawing Sheets

LINEAR DIFFERENTIAL AMPLIFIER

This is a continuation-in-part application of our earlier copending, commonly assigned application Ser. No. 07/253,557 filed Oct. 5, 1988, which is now abandoned.

BACKGROUND OF THE INVENTION

1. Field of the Invention

The present invention relates to a linear differential amplifier which constitutes a part of an electric filter or a similar device to be incorporated, for example, in an IC.

2. Description of the Prior Art

Recently, it has become a common practice to incorporate electric filters comprised of differential amplifiers in an IC. But, a differential amplifier of the operational amplifier type with double amplification stages does not possess a satisfactory frequency characteristic in the high-frequency range such as the video frequency range. Because of this, an electric filter is often realized by constructing a gyrator or a biquad filter with a differential amplifier including a capacitor as a load, which is regarded as a single stage integrator. Such a differential amplifier is shown in FIG. 1, where it is comprised of a pair of bipolar transistors 141 and 142 which form an emitter-coupled pair 143, a capacitor 144 connected between collectors of the transistors 141 and 142 as a load, a constant current source 145 connected between the ground and emitters of the transistors 141 and 142 as a load, a constant current source 145 connected between the ground and emitters of the transistors 141 and 142 for supplying emitter currents $2I_e$, load resistors or their equivalents 146 and 147 connected to the collectors of the transistors 141 and 142, output terminals 148A and 148B connected to the collectors of the transistors 141 and 142, and input terminals 149A and 149B connected to bases of the transistors 141 and 142. In FIG. 1, $V_{cc}$ stands for the power source voltage.

However, an emitter-coupled pair formed by bipolar transistors like the one shown in FIG. 1 possesses poor linearity and changes its transconductance depending on the level of input signals. Consequently, an electric filter comprised of a differential amplifier of this type changes its characteristic depending on the level of input signals, and therefore is not satisfactory in this respect.

There has been proposed a differential amplifier with an improved linearity, such as the one shown in FIG. 2, which has been disclosed by J. O. Voorman et al. in "Bipolar integration of analog gyrator and Laguerre type filters" Proc. ECCTD '83, Stuttgart, pp. 108–110. This differential amplifier is comprised of two emitter-coupled pairs 140 and 150 formed by a pair of transistors 151 and 152, and 153 and 154, respectively, where each of the transistors 152 and 153 has an emitter area four times larger than that of the transistors 151 and 153. Collectors of the transistors 152 and 153 are connected with each other as well as with a load resistor 146 which converts output current $I_3$ of these two transistors, while collectors of transistors 151 and 154 are connected with each other as well as with a load resistor 147 which converts output currents $I_4$ of these two transistors. It further includes a constant current source 155 for the emitter-coupled pair 140 for supplying emitter current $I_e$, and a constant current source 156 for the emitter-coupled pair 150 for supplying emitter currents $I_e$, output terminals 148A and 149B connected to the collectors of the transistors 152 and 153, and 151 and 154, respectively, input terminals 149A and 149B connected to the bases of the transistors 152 and 153, and 151 and 154, respectively. As in FIG. 1, Vcc stands for the power source voltage in FIG. 2.

The improvement in linearity is achieved by producing output currents $I_3$ and $I_4$ as sums of the collector currents with an offset ratio of 1:4 from the transistors of the emitter-coupled pairs 140 and 150, the offset being caused by the fact that these emitter-coupled pairs 140 and 150 comprise transistors with an emitter area ratio of 1:4.

FIG. 3 shows the input-output characteristic of this differential amplifier contrasted with that of the conventional one. In FIG. 3 curve A is the characteristic curve of the differential amplifier of FIG. 2 while curve B is the characteristic curve of the differential amplifier of FIG. 1, and $R_L$ is the resistance of the load. By comparing these two characteristic curves, it can be seen that the range of input levels with the output distortion up to 1% has been increased from ±17 mVpp for the differential amplifier of FIG. 1 to ±48 mVpp for that of FIG. 2.

By constructing a gyrator or a biquad filter with such a differential amplifier of the improved linearity, an improvement can be made in a frequency characteristic by regarding the differential amplifier as a single stage integrator, but obtaining a high direct current gain becomes difficult. The lowering of direct current gain in the integrator of an electric filter causes lowering of the quality Q of the device that includes the electric filter, as can be seen from a comparison to a passive filter comprised of an LC circuit.

To cope with this difficulty, a differential amplifier with its output terminals connected, not directly to bases of another differential amplifier but through emitter-followers to bases of another differential amplifier so as to prevent the lowering of direct current gain has been proposed by K. W. Moulding et al. in "Gyrator Video Filter IC with Automatic Tuning" IEEE Journal of Solid State Circuits, Vol. SC-15, No. 6, pp. 963-968, Dec. 1980.

But, connecting the differential amplifier of FIG. 2 to an emitter-follower is equivalent to connecting a transistor with an emitter area five times larger than the minimal emitter area available. Since the base-emitter capacitance of a transistor is proportional to the emitter area, when the emitter area is five times larger as in this case, the base-emitter capacitance also becomes five times greater. Here, it is not possible to reduce the base-emitter capacitance by reducing the base-emitter capacitance of the transistor of a connecting differential amplifier because a base-emitter capacitance of a transistor, which typically is 1 pF-5 pF, is determined by the smallest size manufacturable which is dictated by the manufacturing process. Thus, in this case the increase in the base-emitter capacitance is unavoidable.

Also, in general, it is ideal for an integrator to possess a pole at a very low frequency and no other poles or zeros at any other frequencies. But, since an actual integrator possesses a number of poles and zeros due to the limited quality of transistors incorporated, it is necessary in order to produce a good electric filter that these poles and zeros are at frequencies 50 to 100 times that of the cutoff frequency of the filter. This means if an electric filter were to have a cutoff frequency of 10 MHz, a second pole or zero have to be at 500 MHz to 1 GHz. In other words, it is necessary to take into consideration frequencies much higher than those used in order to produce a good electric filter.

Now, the aforementioned differential amplifier with its output terminals connected to emitter-followers can be considered as a low-pass filter shown in FIG. 4(A) or its equivalent circuit shown in FIG. 4(B) formed by a base-emitter capacitance $C_{be}$ and output resistance $r_o$ and a base resistance $r_b$ of the emitter-follower 157. In FIG. 4, $V_{cc}$ is the power source voltage, $V_{in}$ is an input voltage, and $V_{out}$ is an output voltage.

In this configuration, there is a pole at the frequency $$fp = \frac{1}{2\pi C_{be}(r_o + r_b)} \quad (1)$$

and if the differential amplifier of FIG. 1 was used with a collector current for the emitter-followers 57 of 0.5 mA, a base-emitter capacitance $C_{be}$ of 2 pF, and a base resistance $r_b$ of 100 Ω;, then since $$r_o = 1/g_m = 52\Omega \quad (2)$$

the pole frequency is $$fp = \frac{1}{2\pi(2 \times 10^{-12})(52 + 100)} = 530 \text{ MHz} \quad (3)$$

On the other hand, if a differential amplifier of FIG. 2 was used with a collector current for the emitter-follower 57 of 1 mA and a base resistance $r_b$ of 40 Ω, then since $$C_{be} = 2 pF \times 5 = 10 pF$$

$$r_o = 1/g_m = 26\Omega \quad (4)$$

the pole frequency is $$fp = \frac{1}{2\pi(10 \times 10^{-12})(26 + 40)} = 240 \text{ MHz} \quad (5)$$

which is less than a half of the previous case, and for the reason explained above, this implies a considerably inferior frequency characteristic.

The preceding arguments show that constructing an emitter-coupled pair by transistors with an emitter area ratio of 1:4 necessitates the use of a transistor with an emitter area four times larger than the minimum size available and this causes the increase in the base-emitter capacitance $C_{be}$ which deteriorates the frequency characteristic at the high-frequency range.

In addition, it is necessary to drive a differential amplifier with a power source with very low impedance in order to operate it at a high-speed. This is quite disadvantageous because this means that if the base-emitter capacitance $C_{be}$ in the last example was 5 pF and the pole frequency $f_p$ was to be at 500 MHz, then the collector current of the emitter-follower 157 would have to be 4 mA, so that not only the power consumption increases considerably, but also the base current of the emitter-follower 157 becomes prohibitive.

Furthermore, since the increase in an emitter area causes the lowering of a cutoff frequency, such an amplifier is not suitable for any device that requires a high-speed operation.

On the other hand, in a device requiring a high S/N ratio, the size of the transistor is increased in order to reduce base resistance. Now, with a differential amplifier with transistors having an emitter area ratio as much as 1:4, the noise level is determined by the base resistance of the transistor with the smaller emitter area which in this case has the higher base resistance. But considering the required frequency characteristic and the designed device size, the highly restricted limit on the allowable increase in the size of a transistor makes this type of a differential amplifier unfavourable even in this respect regarding the noise unless the increase in the manufacturing cost were to be overlooked.

SUMMARY OF THE INVENTION

It is therefore an object of the present invention to provide a differential amplifier capable of achieving an improved linearity, a good high-frequency characteristic, a good S/N ratio, a high direct current gain, and a high-speed operation, all at once.

According to one aspect of the present invention there is provided a linear differential amplifier, comprising: a pair of first and second transistors with their emitters coupled to each other; a pair of third and fourth transistors with their emitters coupled to each other, a collector of said first transistor being connected to a collector of said third transistor and a collector of said second transistor being connected to a collector of said fourth transistor; a pair of input terminals, one of which being coupled to a base of said first transistor, the other one of which being coupled to a base of said fourth transistor; a pair of output terminals, one of which being connected to said collectors of said first and said third transistor, the other one of which being connected to said collectors of said second and said fourth transistors; first voltage source means for applying first offset DC voltage between one of said input terminals and a base of said third transistor, said first voltage source means including a first pair of emitter-followers with each said emitter-follower including transistors of same emitter areas but different collector currents, and first emitter current sources for each transistor of said first pair of emitter-followers which supply emitter currents corresponding to the collector currents; second voltage source means for applying second offset DC voltage of the same magnitude as said first offset DC voltage, between one of said input terminals and a base of said second transistor, said second voltage source means including a second pair of emitter-followers with each said emitter-follower including transistors of same emitter areas but different collector currents, and second emitter current sources for each transistor of said second pair of emitter-followers which supply emitter currents corresponding to the collector currents; constant current source means for supplying emitter currents to said first, second, third, and fourth transistors; and load resistor means for converting collector currents of said first, second, third, and fourth transistors into output voltages.

According to another aspect of the present invention there is provided a linear differential amplifier, comprising: a pair of first and second transistors with their emitters coupled to each other; a pair of third and fourth transistors with their emitters coupled to each other, a collector of said first transistor being connected to a collector of said third transistor and a collector of said second transistor being connected to a collector of said fourth transistor, and said first and fourth transistors having emitter areas different from those of said second and third transistors; a pair of input terminals, one of which being coupled to a base of said first transistor, the other one of which being coupled to a base of said fourth transistor; a pair of output terminals, one of which being connected to said collectors of said first and said third transistor, the other one of which being connected to said collectors of said second and said fourth transistors; first voltage source means for applying first offset DC voltage between one of said input terminals and a base of said third transistor, said first voltage source means including a first pair of emitter-followers with each said emitter-follower including transistors of different emitter areas, and first emitter current sources for supplying constant emitter currents to said transistors of said first pair of emitter followers; second voltage source means for applying second offset DC voltage of the same magnitude as said first offset DC voltage, between one of said input terminals and a base of said second transistor, said second voltage source means including a second pair of emitter-followers with each said emitter-follower including transistors of different emitter areas, and second emitter current sources for supplying constant emitter currents to said transistors of said second pair of emitter followers; constant current source means for supplying emitter currents to said first, second, third, and fourth transistors; and load resistor means for converting collector currents of said first, second, third, and fourth transistors into output voltages.

According to another aspect of the present invention there is provided a linear differential amplifier, comprising: a pair of first and second transistors with their emitters coupled to each other; a pair of third and fourth transistors with their emitters coupled to each other, a collector of said first transistor being connected to a collector of said third transistor and a collector of said second transistor being connected to a collector of said fourth transistor, and said first and fourth transistors having emitter areas different from those of said second and third transistors; a pair of input terminals, one of which being coupled to a base of said first transistor, the other one of which being coupled to a base of said fourth transistor; a pair of output terminals, one of which being connected to said collectors of said first and third transistor, the other one of which being connected to said collectors of said second and said fourth transistors; first voltage source means for applying first offset DC voltage between one of said input terminals and a base of said third transistor, said first voltage source means including a first pair of emitter-followers with each said emitter-follower including transistors of same emitter areas but different collector currents, and first emitter current sources for each transistor of said first pair of emitter-followers which supply emitter currents corresponding to the collector currents; second voltage source means for applying second offset DC voltage of the same magnitude as said first offset DC voltage, between one of said input terminals and a base of said second transistor, said second voltage source means including a second pair of emitter-followers with each said emitter-follower including transistors of same emitter areas but different collector currents, and second emitter curent sources for each transistor of said second pair of emitter-followers which supply emitter currents corresponding to the collector currents; constant current source means for supplying emitter currents to said first, second, third, and fourth transistors; and load resistor means for converting collector currents of said first, second, third, and fourth transistors into output voltages.

According to another aspect of the present invention, there is provided a linear differential amplifier, comprising: a pair of first and second transistors with their emitters coupled to each other, each of which having a diode connected to its emitter; a pair of third and fourth transistors with their emitters coupled to each other, each of which having a diode connected to its emitter, a collector of said first transistor being connected to a collector of said third transistor and a collector of said second transistor being connected to a collector of said fourth transistor; a pair of output terminals, one of which being connected to said collectors of said first and said third transistor, the other one of which being connected to said collectors of said second and said fourth transistors; a first voltage source means for applying first offset DC voltage between one of said input terminals and a base of said third transistor, said first voltage source means including a first pair of emitter-followers with each said emitter-follower including transistors of different emitter areas, and first emitter current sources for supplying constant emitter currents to said transistors of said first pair of emitter-followers; a second voltage source means for applying second offset DC voltage of the same magnitude as said first offset DC voltage, between the other one of said input terminals and a base of said second transistor, said second voltage source means including a second pair of emitter-followers with each of said emitter-followers including transistors of different emitter areas, and second emitter current sources for supplying constant emitter currents to the transistors of said second pair of emitter-followers; constant current source means for supplying emitter currents to said first, second, third, and fourth transistors; and load resistor means for converting collector currents of said first, second, third, and fourth transistors into output voltages.

According to another aspect of the present invention there is provided a linear differential amplifier, comprising: a pair of first and second transistors with their emitters coupled to each other, each of which having a diode connected to its emitter; a pair of third and fourth transistors with their emitters coupled to each other, each of which having a diode connected to its emitter, a collector of said first transistor being connected to a collector of said third transistor and a collector of said second transistor being connected to a collector of said fourth transistor; a pair of output terminals, one of which being connected to said collectors of said first and said third transistor, the other one of which being connected to said collectors of said second and said fourth transistors; a first voltage source means for applying first offset DC voltage between one of said input terminals and a base of said third transistor, said first voltage source means including a first pair of emitter-followers with each said emitter-follower including transistors of different emitter areas and different collector currents, and emitter current sources for each transistor of the emitter-followers which supply emitter currents corresponding to the collector currents; a second voltage source means for applying second offset DC voltage of the same magnitude as said first offset DC voltage, between the other one of said input terminals and a base of said second transistor, said second voltage source means including a second pair of emitter-followers with each of said emitter-followers including transistors of different emitter areas and different collector currents, and emitter current sources for each transistor of the emitter-followers which supply emitter currents corresponding to the collector currents; constant current source means for supplying emitter currents to said first, second, third, and fourth transistors; and load resistor means for converting collector currents of said first, second, third, and fourth transistors into output voltages.

According to another aspect of the present invention there is provided a linear differential amplifier, comprising: a pair of first and second transistors with their emitters coupled to each other, one of which having a number of diodes connected to its emitter while another one of which having a different number of diodes connected to its emitter; a pair of third and fourth transistors with their emitters coupled to each other, one of which having a number of diodes connected to its emitter while another one of which having a different number of diodes connected to its emitter, a collector of said first transistor being connected to a collector of said third transistor and a collector of said second transistor being connected to a collector of said fourth transistor, and said first and fourth transistors having emitter areas different from that of said second and third transistors; a pair of input terminals, one of which being coupled to the base of said first transistor, the other one of which being coupled to the base of said fourth transistor; a pair of output terminals, one of which being connected to the collectors of said first and said third transistors, the other one of which being connected to the collectors of said second and said fourth transistors; first voltage source means for applying first offset DC voltage between one of said input terminals and a base of said third transistor, said first voltage source means including a first pair of emitter-followers with each of the said emitter-followers including transistors of different emitter areas, and first emitter current sources for supplying constant emitter currents to said transistors of said first pair of emitter-followers; second voltage source means for applying second offset DC voltage of the same magnitude as said first offset DC voltage, between the other one of said input terminals and a base of said second transistor, said second voltage source means including a second pair of emitter-followers with each of said emitter-followers including transistors of different emitter areas, and second emitter current sources for supplying constant emitter currents to the transistors of said second pair of emitter-followers; constant current source means for supplying emitter currents to said first, second, third, and fourth transistors; and load resistor means for converting collector currents of said first, second, third, and fourth transistors into output voltages.

According to another aspect of the present invention there is provided a linear differential amplifier, comprising: a pair of first and second transistors with their emitters coupled to each other, one of which having a number of diodes connected to its emitter while another one of which having a different number of diodes connected to its emitter; a pair of third and fourth transistors with their emitters coupled to each other, one of which having a number of diodes connected to its emitter while another one of which having a different number of diodes connected to its emitter, a collector of said first transistor being connected to a collector of said third transistor and a collector of said second transistor being connected to a collector of said fourth transistor, and said first and said fourth transistors having emitter areas different from that of said second and said third transistors; a pair of input terminals, one of which being coupled to the base of said first transistor, the other one of which being coupled to the base of said fourth transistor; a pair of output terminals one of which being connected to the collectors of said first and said third transistors, the other one of which being connected to the collectors of said second and said fourth transistors; first voltage source means for applying first offset DC voltage between one of said input terminals and the base of said third transistor, said first voltage source means including a first pair of emitter-followers with each of said emitter-followers including transistors of the same emitter areas but different collector currents, and first emitter current sources for each of said transistors of said first pair of emitter-followers which supply emitter currents corresponding to the collector currents; second voltage source means for applying second offset DC voltage of the same magnitude as said first offset DC voltage, between the other one of said input terminals and the base of said second transistor, said second voltage source means including a second pair of emitter-followers with each of said emitter-followers including transistors of the same emitter areas but different collector currents, and second emitter current sources for each transistor of said second pair of emitter-followers which supply emitter currents corresponding to the collector currents; constant current source means for supplying emitter currents to said first, second, third, and fourth transistors, and load resistor means for converting collector currents of said first, second, third, and fourth transistors into output voltages.

The other features and advantages of the present invention will become apparent from the following description taken in conjunction with the accompanying drawings.

DETAILED DESCRIPTION OF THE PREFERRED EMBODIMENTS

Figure 1:
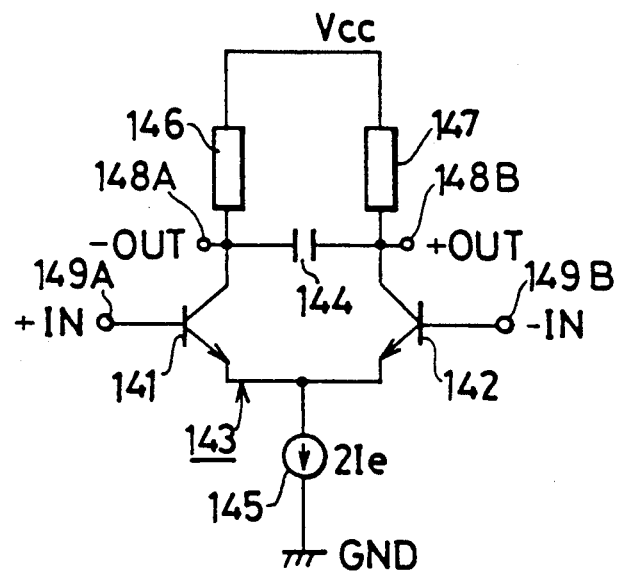
FIG. 1 is a circuit diagram of a differential amplifier according to one example of the prior art.
Figure 2:
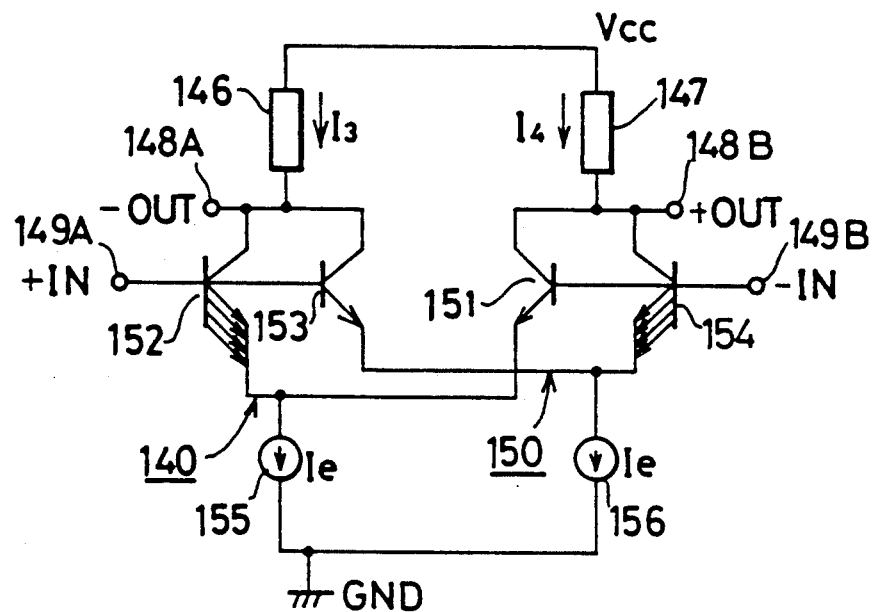
FIG. 2 is a circuit diagram of a differential amplifier according to another example of the prior art.
Figure 3:
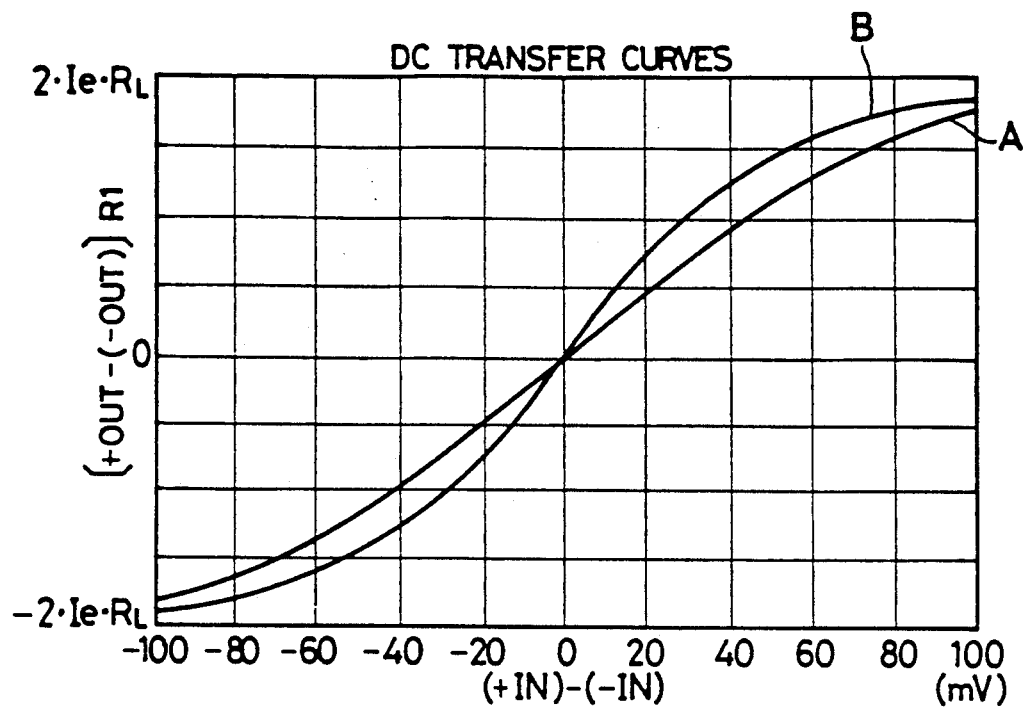
FIG. 3 is a graph showing the input-output characteristics of the two prior art differential amplifiers of FIG. 1 and FIG. 2.
Figure 4A:
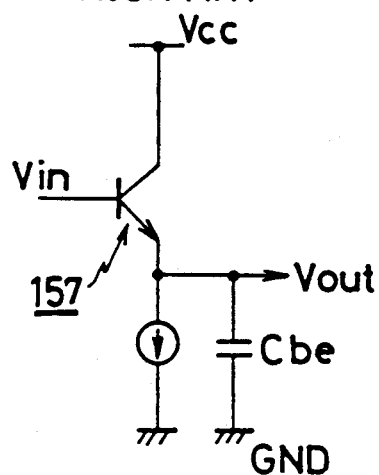
FIG. 4(A) and (B) are circuit diagram for explaining the problem of a prior art differential amplifier.
Figure 4B:
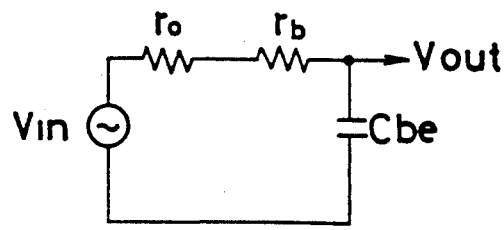
Figure 5:
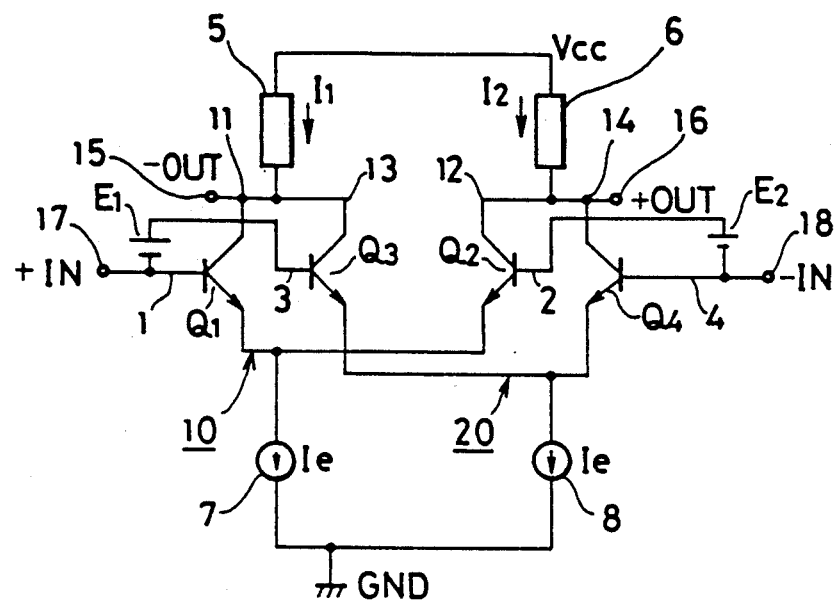
FIG. 5 is a circuit diagram of the first embodiment of a linear differential amplifier according to the present invention.

Referring now to FIG. 5, there is shown a first embodiment of a linear differential amplifier according to the present invention.

In this embodiment, a linear differential amplifier comprises a first emitter-coupled pair 10 formed by two transistors $Q_1$ and $Q_2$, a second emitter-coupled pair 20 formed by two transistors $Q_3$ and $Q_4$, where a collector 11 of the transistor $Q_1$ is connected to a collector 13 of the transistor $Q_3$ and a collector 12 of the transistor $Q_2$ is connected to a collector 14 of the transistor $Q_4$, a first constant voltage source $E_1$ for applying a constant voltage between a base 1 of the transistor $Q_1$ and a base 3 of the transistor $Q_3$, a second constant voltage source $E_2$ for applying the same voltage applied by the first constant voltage source $E_1$ between a base 2 of the transistor $Q_2$ and a base 4 of the transistor $Q_4$, a first load resistor 5 for converting collector currents of the transistors $Q_1$ and $Q_3$ shown collectively as an output current $I_1$ into an output voltage, a second load resistor 6 for converting collector currents of the transistors $Q_2$ and $Q_4$ shown collectively as an output current $I_2$ into an output voltage, a first constant current source 7 for supplying emitter currents $I_e$ to the transistors $Q_1$ and $Q_3$, a second constant current source 8 for supplying the same emitter currents $I_e$ to the transistors $Q_2$ and $Q_4$, output terminals 15 and 16, and input terminals 17 and 18. A base 1 of the transistor $Q_1$ and a base 3 of the transistor $Q_3$ are connected to an input terminal 17, a base 2 of the transistor $Q_2$ and a base 4 of the transistor $Q_4$ are connected to an input terminal 18, and the amplifier is emitter-grounded as shown. In FIG. 5, $V_{cc}$ stands for the power source voltage.

In this linear differential amplifier, due to the constant voltages applied by the constant voltage sources $E_1$ and $E_2$, collector currents of the transistors $Q_1$, $Q_2$, $Q_3$, and $Q_4$ acquire offsets. These collector currents with offsets are then added to yield the output currents $I_1$ and $I_2$, which are subsequently converted into output voltages by the load resistors 5 and 6.

The improved linearity is achieved in this linear differential amplifier, as in the prior art explained above, by obtaining output currents $I_1$ and $I_2$ as sums of collector currents with offsets. In this embodiment, however, offsets are produced, not by the difference of the emitter areas of transistors as in the prior art, but by the constant offset voltage applied by the constant voltage sources $E_1$ and $E_2$. Therefore, transistors $Q_1$, $Q_2$, $Q_3$ and $Q_4$ of the emitter-coupled pairs 10 and 20 do not need to have a large emitter area ratio. In fact, they can be of minimum the size available. Consequently, improved linearity can be achieved in this embodiment while maintaining a high S/N ratio, a good high-frequency characteristic, a high direct current gain, and a high-speed operation capability, by incorporating appropriate configurations.

Such configurations will now be explained in the following, where those parts identical to those in the first embodiment will be given the same symbols in the figures, and the explanations of these will be omitted.

Figure 6:
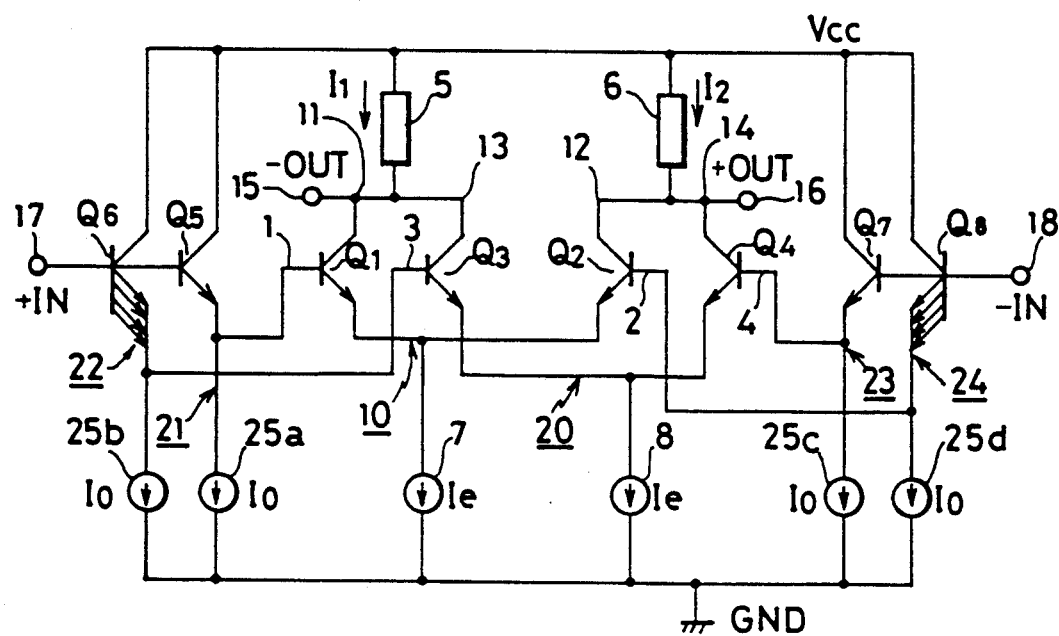
FIG. 6 is a circuit diagram of the second embodiment of a linear differential amplifier according to the present invention.

Referring now to FIG. 6, there is shown a second embodiment of a linear differential amplifier according to the present invention. In this embodiment, the constant voltage sources, $E_1$ and $E_2$ in the last embodiment, are comprised of pairs of emitter-followers 21 and 22, and 23 and 24. Each pair is comprised of emitter-followers including transistors with an emitter area ratio of 1:4, and each emitter-follower is connected to an emitter current source for a transistor. Namely, the constant voltage source for the transistors $Q_1$ and $Q_3$ is comprised of the emitter-followers 21 and 22 where the emitter-follower 22 has a transistor $Q_6$ with an emitter area four times larger than that of a transistor $Q_5$ of the emitter-follower 21, and the emitter-followers 21 and 22 are connected to emitter current sources 25a and 25b, respectively, which supply emitter currents $I_o$ to the transistors $Q_5$ and $Q_6$, respectively. Likewise, the constant voltage source for the transistors $Q_2$ and $Q_4$ is comprised of the emitter-followers 23 and 24 where the emitter-follower 24 has a transistor $Q_8$ with an emitter area four times larger than that of a transistor $Q_7$ of the emitter-follower 23, and the emitter-followers 23 and 24 are connected to emitter current sources 25c and 25d, respectively, which supply emitter currents $I_o$ to the transistors $Q_7$ and $Q_8$, respectively.

In this embodiment, due to the difference in emitter areas of paired emitter-followers, the base-emitter voltages $V_{be}$ for the transistors $Q_5$ and $Q_6$ are given by $$V_{be}(Q_5) = V_t \ln(I_c/I_s)(V)$$

$$V_{be}(Q_6) = V_t \ln(I_c/4I_s)(V)$$

where $I_s$ is the saturation current of the transistors, $I_c$ is the collector current of the transistors, and $V_t$ is the thermal voltage of the transistors. Thus, there is a constant voltage gap of $V_t \ln 4(V)$ between the transistors $Q_5$ and $Q_6$, and this produces the offsets for the collector currents of the transistors $Q_1$ and $Q_3$. Similarly, the same constant voltage gap with the opposite sign exists between the transistors $Q_7$ and $Q_8$, and this produces the offsets for the collector currents of the transistors $Q_2$ and $Q_4$.

The improved linearity is achieved in this embodiment, just as in the last embodiment, by obtaining output currents $I_1$ and $I_2$ as sums of the collector currents with offsets. In addition, by the use of the emitter-followers it is possible in this embodiment to achieve improved linearity while maintaining a high S/N ratio, a good high-frequency characteristic, a high direct current gain, and a high-speed operation capability. This is because, as in the last embodiment, the transistors $Q_1$, $Q_2$, $Q_3$ and $Q_4$ do not need to have a larger emitter area ratio, and can be of minimum size.

Figure 7:
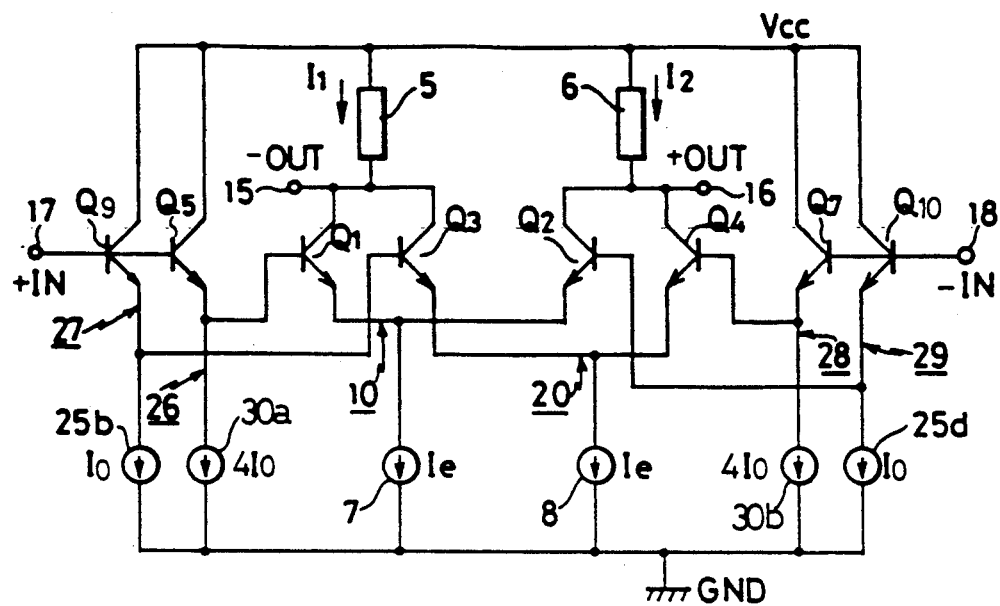
FIG. 7 is a circuit diagram of the third embodiment of a linear differential amplifier according to the present invention.

Referring now to FIG. 7, there is shown a third embodiment of a linear differential amplifier according to the present invention. In this embodiment, the constant voltage sources in the embodiment of FIG. 6 are modified such that the transistors of paired emitter-followers $Q_5$ and $Q_9$, $Q_7$ and $Q_{10}$ now have the same emitter areas, but at the same time the transistors $Q_5$ and $Q_7$ are connected to the emitter current sources 30a and 30b, respectively, which supply emitter currents $4I_o$ which is four times greater than that supplied by the emitter current sources 25b and 25d to the transistors $Q_9$ and $Q_{10}$.

It is obvious that by this configuration, there is a constant voltage gap of $V_t \ln 4 (V)$ between the transistors $Q_5$ and $Q_9$ and $-V_t \ln 4 (V)$ between the transistors $Q_7$ and $Q_{10}$, just as in the embodiment of FIG. 6. Thus, all the advantages of the embodiment of FIG. 6 can be obtained by this embodiment as well.

Figure 8:
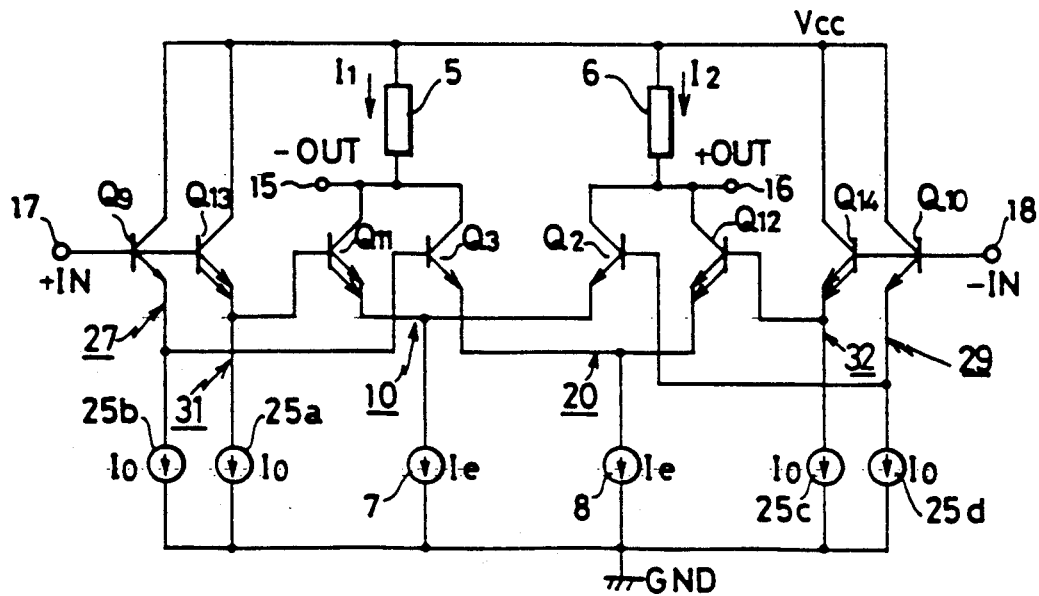
FIG. 8 is a circuit diagram of the fourth embodiment of a linear differential amplifier according to the present invention.

Referring now to FIG. 8, there is shown a fourth embodiment of a linear differential amplifier according to the present invention. In this embodiment, the constant voltage sources in the embodiment of FIG. 6 are modified such that each pair transistors of paired emitter-followers $Q_9$ and $Q_{13}$, and $Q_{10}$ and $Q_{14}$ now have an emitter area ratio of 1:2, but at the same time transistors of the emitter-coupled pairs, $Q_1$ and $Q_4$ in the embodiment of FIG. 6, are also replaced by transistors $Q_{11}$ and $Q_{12}$ which have the emitter area twice as large as that of the transistors $Q_2$ and $Q_3$.

It is clear that by this configuration, the same offsets as in the embodiment of FIG. 6 are produced for collector currents of the transistors $Q_2$, $Q_3$, $Q_{11}$ and $Q_{12}$. Also, the effect of combining transistors of different emitter areas and emitter-followers can still be at a tolerable level because the emitter area ratio involved here is only 1:2. Thus, practically all the advantages of the embodiment of FIG. 6 may be obtained by this embodiment.

Figure 9:
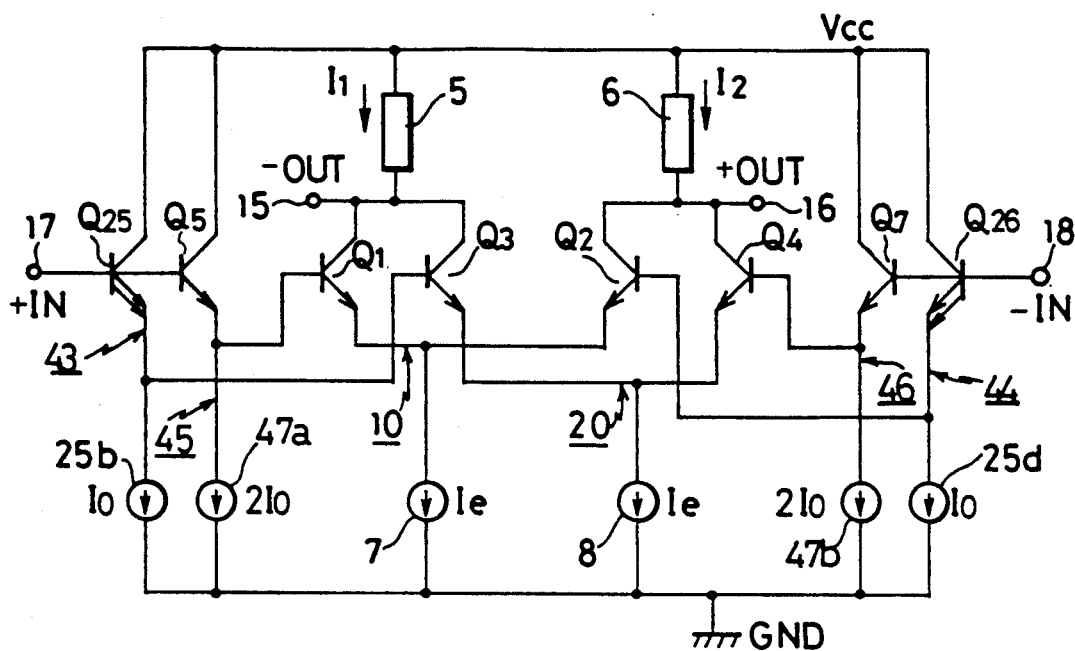
FIG. 9 is a circuit diagram of the fifth embodiment of a linear differential amplifier according to the present invention.

Referring now to FIG. 9, there is shown a fifth embodiment of a linear differential amplifier according to the present invention. In this embodiment, the features of the third embodiment of FIG. 7 and the fourth embodiment of FIG. 8 are combined by replacing the transistors $Q_9$ and $Q_{10}$ in FIG. 7 with transistors $Q_{25}$ and $Q_{26}$ such that each pair transistors of paired emitter-followers $Q_5$ and $Q_{25}$, and $Q_7$ and $Q_{26}$ now have an emitter area ratio of 1:2, and at the same time connecting the transistors $Q_5$ and $Q_7$ to the emitter current sources 47a and 47b, respectively, which supply emitter currents $2I_o$ which is twice greater than that supplied by the emitter current sources 25b and 25d to the transistors $Q_{25}$ and $Q_{26}$. Again, practically all the advantages of the embodiment of FIG. 6 may be obtained by this embodiment.

Figure 10:
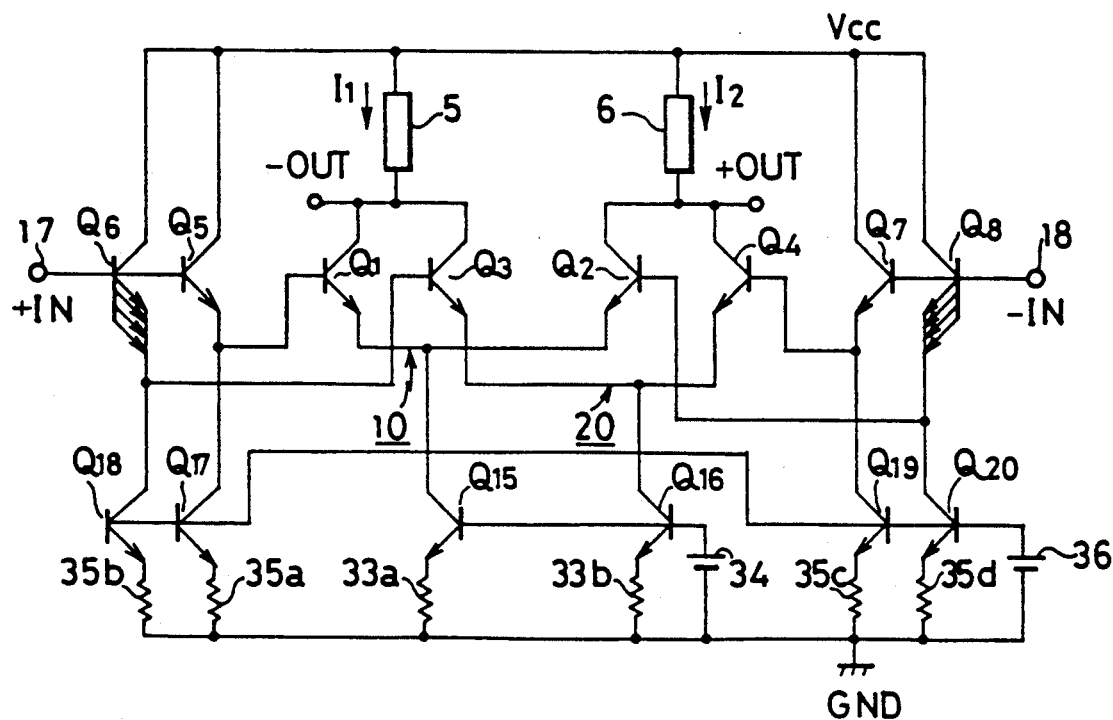
FIG. 10 is a circuit diagram of the sixth embodiment of a linear differential amplifier according to the present invention.

Referring now to FIG. 10, there is shown a sixth embodiment of a linear differential amplifier according to the present invention. In this embodiment, each of the constant current sources, 7 and 8 in the embodiment of FIG. 6, and the emitter current sources, 25a, 25b 25c and 25d in the embodiment of FIG. 6 comprise a transistor with a resistor connected between its emitter and ground. Namely, the constant current source for the transistors $Q_1$ and $Q_2$ comprises a transistor $Q_{15}$ with a resistor 33a connected between its emitter and ground, the constant current source for the transistors $Q_3$ and $Q_4$ comprises a transistor $Q_{16}$ with a resistor 33b connected between its emitter and ground, where these transistors $Q_{15}$ and $Q_{16}$ are biased by the constant voltage 34.

Likewise, the emitter current source for the transistor $Q_5$ comprises a transistor $Q_{17}$ with a resistor 35a connected between its emitter and ground, the emitter current source for the transistor $Q_6$ comprises a transistor $Q_{18}$ with a resistor 35b connected between its emitter and the ground, the emitter current source for the transistor $Q_7$ is comprised of a transistor $Q_{19}$ with a resistor 35c connected between its emitter and ground, the emitter current source for the transistor $Q_8$ comprises a transistor $Q_{20}$ with a resistor 35d connected between its emitter and ground, where these transistors $Q_{17}$, $Q_{18}$, $Q_{19}$ and $Q_{20}$ are biased by the constant voltage 36.

Due to this configuration of various current sources, the noise produced by these current sources is reduced in this embodiment while retaining all the advantage of the embodiment of FIG. 6, so that in this embodiment an even higher S/N ratio may be obtained.

It is obvious that similar improvement of an S/N of FIG. 8 by implementing the similar configurations as done in this embodiment for the embodiment of FIG. 6.

Figure 11:
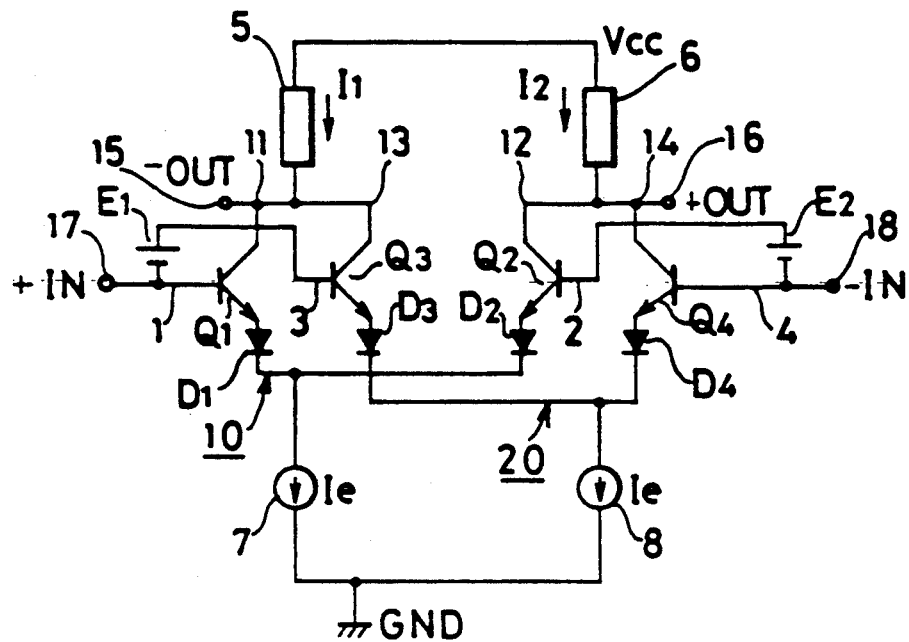
FIG. 11 is a circuit diagram of the seventh embodiment of a linear differential amplifier according to the present invention.

Referring now to FIG. 11, there is shown a seventh embodiment of a linear differential amplifier according to the present invention. In this embodiment, the linear differential amplifier of FIG. 5 is modified by connecting diodes $D_1$, $D_2$, $D_3$ and $D_4$ between the emitter of each of the transistors $Q_1$, $Q_2$, $Q_3$ and $Q_4$ and the constant current sources 7 and 8, where the diodes $D_1$, $D_2$, $D_3$ and $D_4$ are all equivalent to each other.

By means of these additional diodes, it is possible in this embodiment to obtain an even wider range of linearity while retaining all the advantages of the embodiment of FIG. 5.

Figure 12:
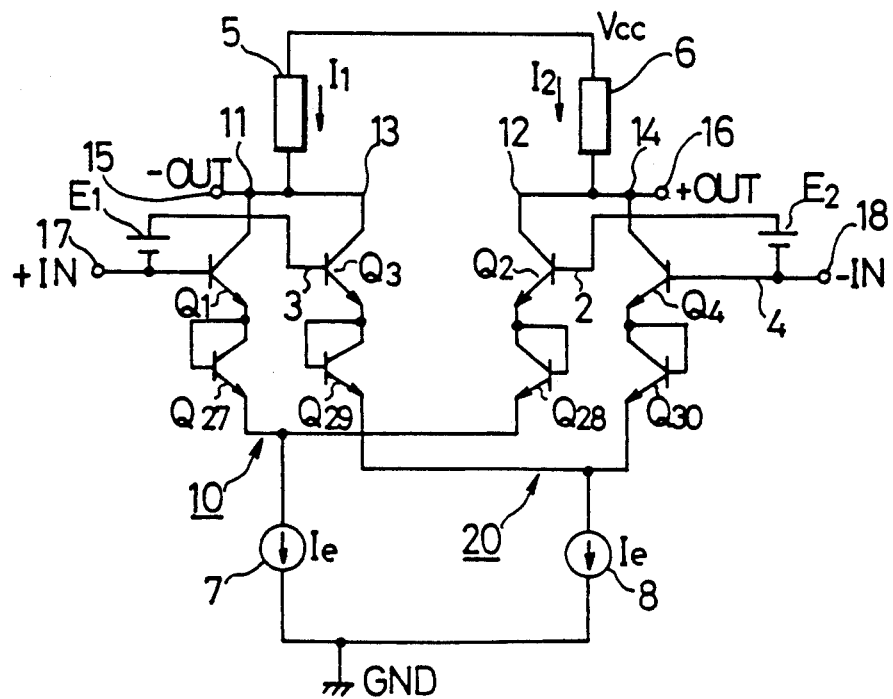
FIG. 12 is a circuit diagram of the eighth embodiment of a linear differential amplifier according to the present invention.

Referring now to FIG. 12, there is shown an eighth embodiment of a linear differential amplifier according to the present invention. In this embodiment, the linear differential amplifier of FIG. 11 is further modified by replacing the diodes $D_1$, $D_2$, $D_3$ and $D_4$ with transistors $Q_{27}$, $Q_{28}$, $Q_{29}$, and $Q_{30}$, respectively, where each of these transistors $Q_{27}$, $Q_{28}$, $Q_{29}$, and $Q_{30}$ has its base and collector connected together so as to function effectively as a diode. Thus, as in the seventh embodiment above, it is also possible in this embodiment to obtain an even wider range of linearity while retaining all the advantages of the embodiment of FIG. 5.

There are several other configurations based on the various embodiments described so far, each one of which can possesses the various advantages of the various embodiments described above together in one. Such configurations will now be described.

Figure 13:
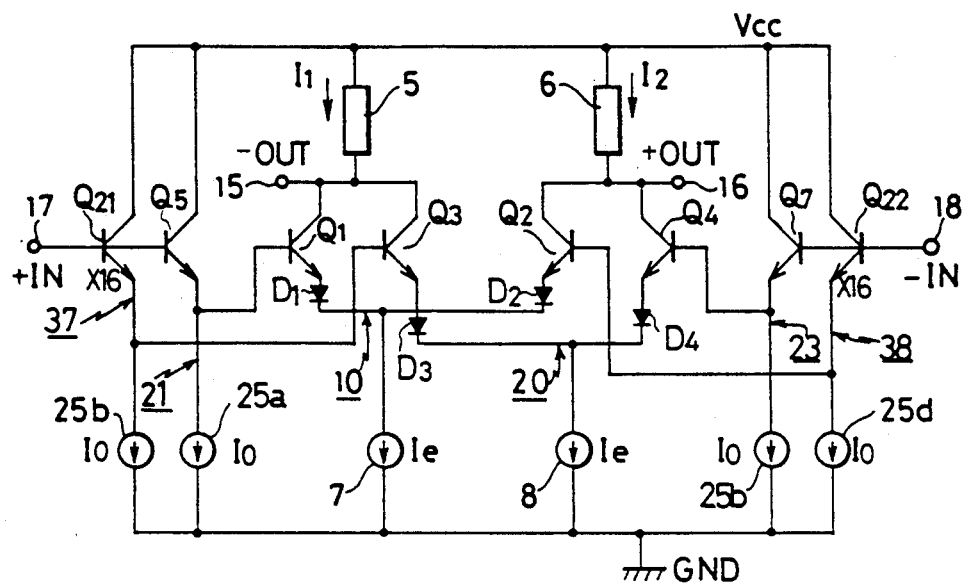
FIG. 13 is a circuit diagram of the ninth embodiment of a linear differential amplifier according to the present invention.

Referring now to FIG. 13, there is shown a ninth embodiment of a linear differential amplifier according to the present invention. In this embodiment, the linear differential amplifier of FIG. 11 is equipped with pairs of emitter-followers 21 and 37, and 23 and 38, similar to those described above in the second embodiment of FIG. 6, as the constant voltage sources. Here, the constant voltage sources in the embodiment of FIG. 6 are modified such that each pair transistors of paired emitter-followers $Q_5$ and $Q_{21}$, and $Q_7$ and $Q_{22}$ now have an emitter area ratio of 1:16.

Figure 14:
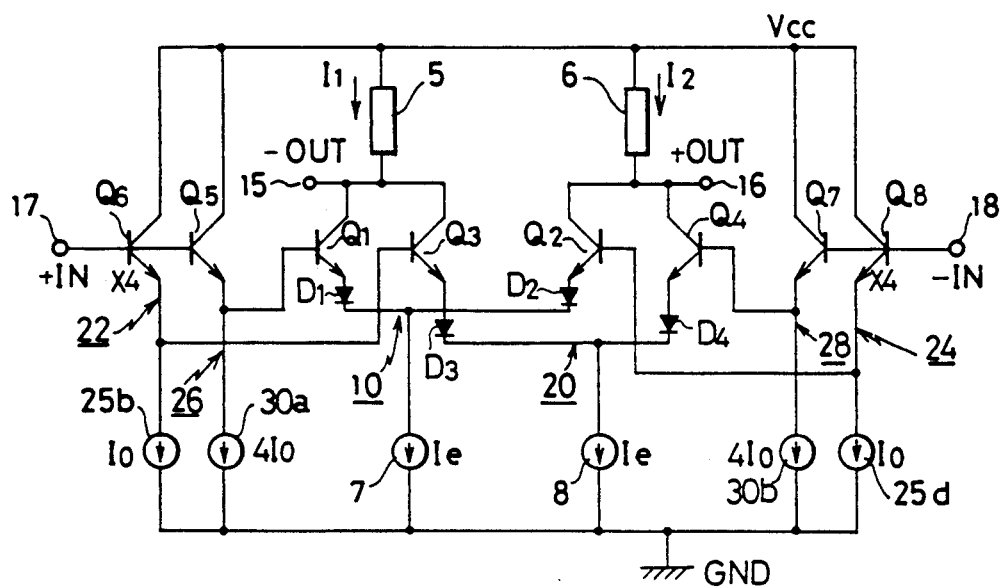
FIG. 14 is a circuit diagram of the tenth embodiment of a linear differential amplifier according to the present invention.

Referring now to FIG. 14, there is shown a tenth embodiment of a linear differential amplifier according to the present invention. In this embodiment, the linear differential amplifier of FIG. 11 is equipped with pairs of emitter-followers 22 and 26, and 24 and 28, where the emitter-followers 22 and 24 appeared in the second embodiment of FIG. 6 while the emitter-followers 26 and 28 appeared in the third embodiment of FIG. 7, as the constant voltage sources.

Figure 15:
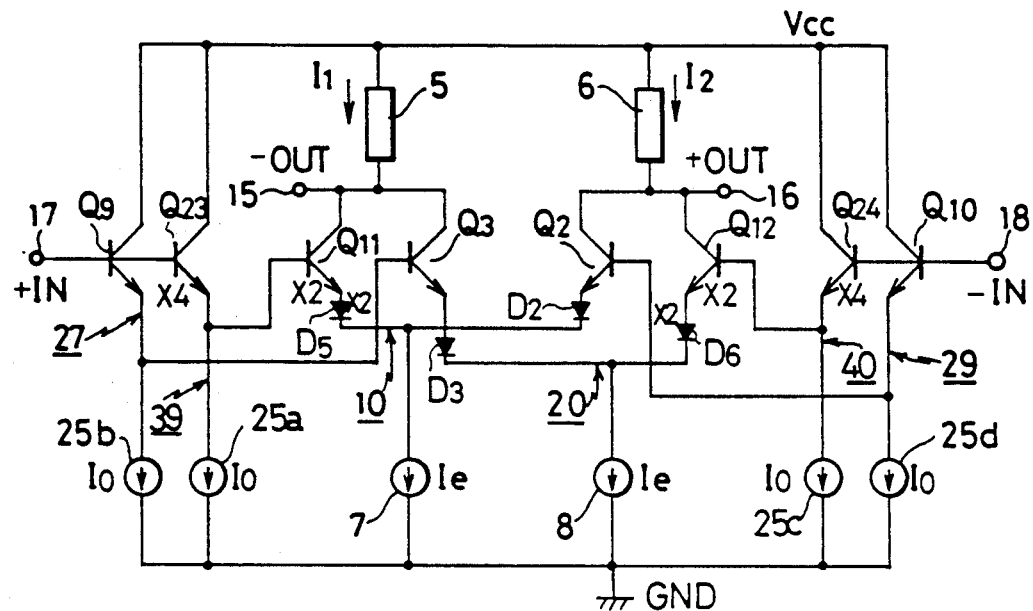
FIG. 15 is a circuit diagram of the eleventh embodiment of a linear differential amplifier according to the present invention.

Referring now to FIG. 15, there is shown an eleventh embodiment of a linear differential amplifier according to the present invention. In this embodiment, the linear differential amplifier of FIG. 11 is modified by replacing the transistors $Q_1$ and $Q_4$ by the transistors $Q_{11}$ and $Q_{12}$ which have the emitter area twice as large as those of the transistors $Q_2$ and $Q_3$ and which appeared in the fourth embodiment of FIG. 8, and also by replacing the diodes $D_1$ and $D_3$ connected to the transistors $Q_{11}$ and $Q_{12}$ by diodes $D_5$ and $D_6$, each of which is equivalent to two diodes $D_1$ and $D_4$ connected in series. In addition, this differential amplifier is equipped with pairs of emitter-followers 27 and 39, and 29 and 40, where each pair transistors of paired emitter-followers $Q_9$ and $Q_{23}$, and $Q_{10}$ and $Q_{24}$ have an emitter area ratio of 1:4, as the constant voltage sources.

Figure 16:
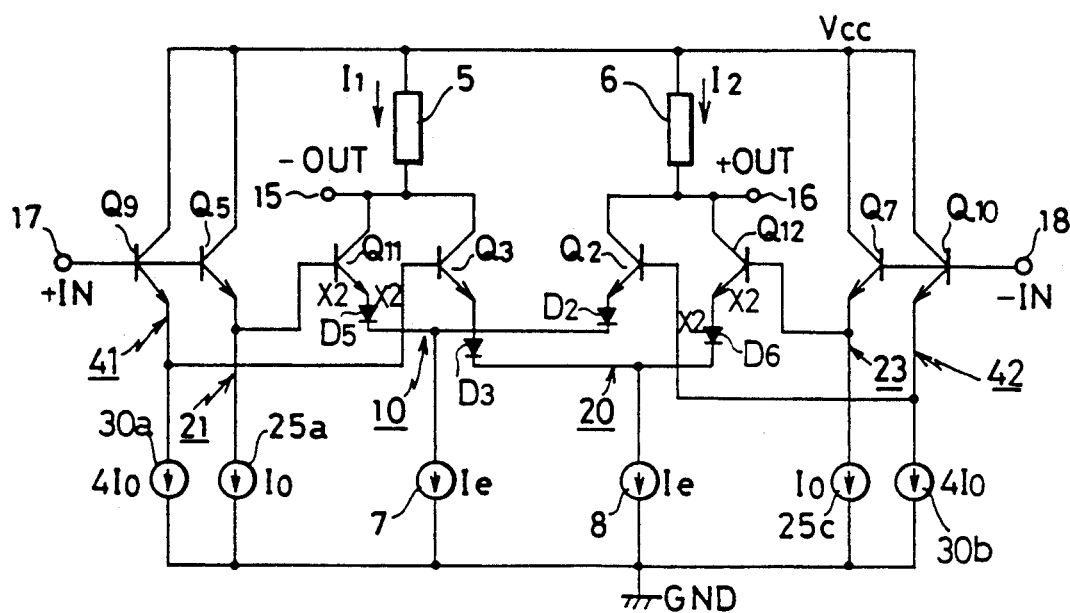
FIG. 16 is a circuit diagram of the twelfth embodiment of a linear differential amplifier according to the present invention.

Referring now to FIG. 16, there is shown a twelfth embodiment of a linear differential amplifier according to the present invention. In this embodiment, the linear differential amplifier of FIG. 15 is further modified by changing the pairs of emitter-followers 27 and 39, and 29 and 40 to pairs of emitter-followers 21 and 41, and 23 and 42, such that the transistors of paired emitter-followers $Q_5$ and $Q_9$, $Q_7$ and $Q_{10}$ now have the same emitter areas, but at the same time the transistors $Q_9$ and $Q_{10}$ are connected to the emitter current sources 30a and 30b, respectively, which supply emitter currents $4I_o$ which is four times greater than that supplied by the emitter current sources 25a and 25c to the transistors $Q_5$ and $Q_7$.

Figure 17:
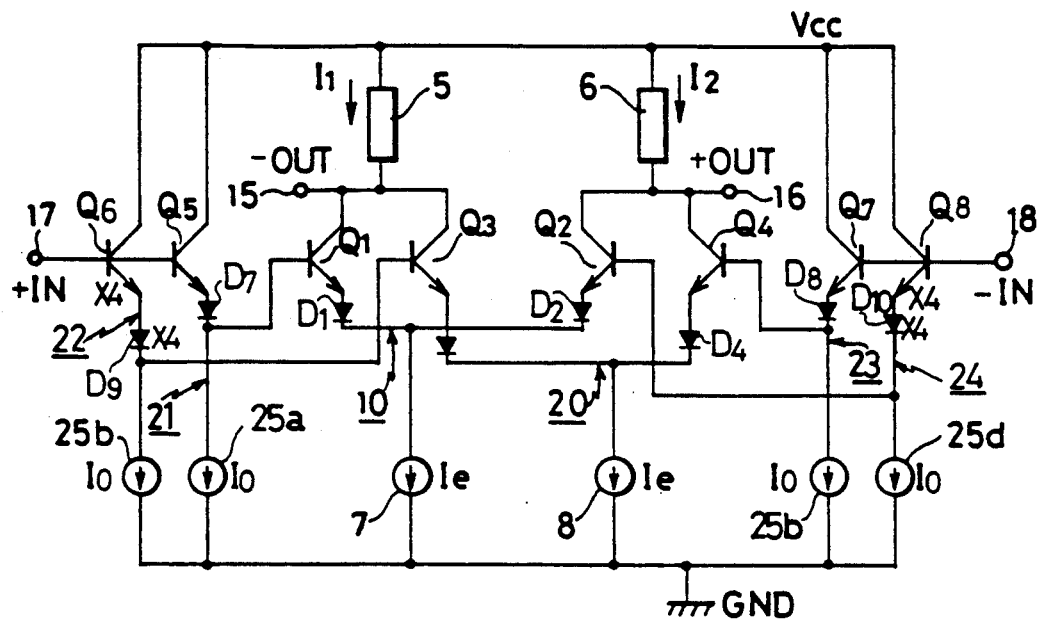
FIG. 17 is a circuit diagram of the thirteenth embodiment of a linear differential amplifier according to the present invention.

Referring now to FIG. 17, there is shown a thirteenth embodiment of a linear differential amplifier according to the present invention. In this embodiment, the linear differential amplifier of FIG. 13 is further modified by changing the pairs of emitter-followers 21 and 37, and 23 and 38 to the pairs of emitter-followers 21 and 22, and 23 and 24, such that the transistors of the paired emitter-followers $Q_5$ and $Q_6$, $Q_7$ and $Q_8$ have an emitter area ratio of 1:4. In addition, in this embodiment, diodes $D_7$, $D_8$, $D_9$, and $D_{10}$ are connected between the emitter of each of the transistors $Q_5$, $Q_7$, $Q_6$, and $Q_8$, respectively, and the constant current sources 25a, 25b, 25c, and 25d, respectively, of which each of the diodes $D_7$ and $D_8$ is equivalent to the diodes $D_1$ while each of the diodes $D_9$ and $D_{10}$ is equivalent to four diodes $D_1$, $D_2$, $D_3$, and $D_4$ connected together in series. The use of these diodes $D_7$, $D_8$, $D_9$, and $D_{10}$ connected to the transistors $Q_5$, $Q_7$, $Q_6$, and $Q_8$ of the pairs of the emitter-followers 21 and 22, and 23 and 24 make it possible to improve the linearity without employing transistors of larger emitter areas.

Figure 18:
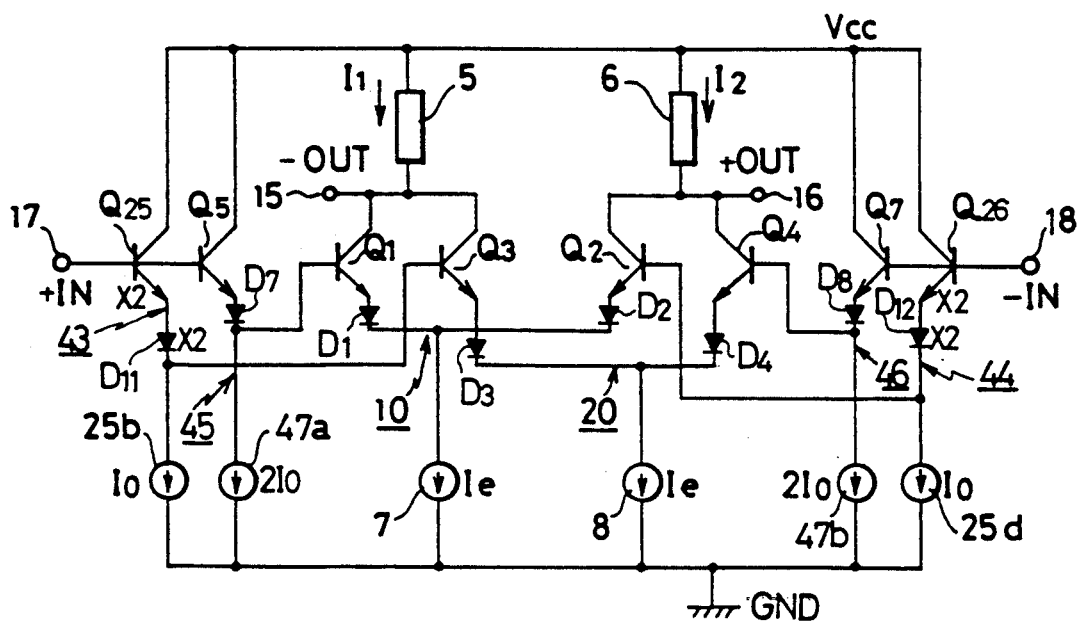
FIG. 18 is a circuit diagram of the fourteenth embodiment of a linear differential amplifier according to the present invention.

Referring now to FIG. 18, there is shown a fourteenth embodiment of a linear differential amplifier according to the present invention. In this embodiment, the linear differential amplifier of FIG. 17 is further modified by changing the pairs of emitter-followers 21 and 22, and 23 and 24 to the pairs of emitter-followers 43 and 45, and 44 and 46, such that the transistors of the paired emitter-followers $Q_5$ and $Q_{25}$, $Q_7$ and $Q_{26}$ have an emitter area ratio of 1:2, and at the same time by connecting the transistors $Q_5$ and $Q_7$ to the emitter current sources 47a and 47b, respectively, which supply emitter currents $2I_o$ which is four times greater than that supplied by the emitter current sources 25b and 25d to the transistors $Q_{25}$ and $Q_{26}$, and also by replacing the diodes $D_9$, and $D_{10}$ by diodes $D_{11}$ and $D_{12}$, each of which is equivalent to two diodes $D_1$ and $D_4$ connected together in series. Again, the use of these diodes $D_7$, $D_8$, $D_{11}$, and $D_{12}$ connected to the transistors $Q_5$, $Q_7$, $Q_{25}$, and $Q_{26}$ of the pairs of the emitter-followers 43 and 45, and 44 and 46 make it possible to improve the linearity without employing transistors of larger emitter areas.

Figure 19:
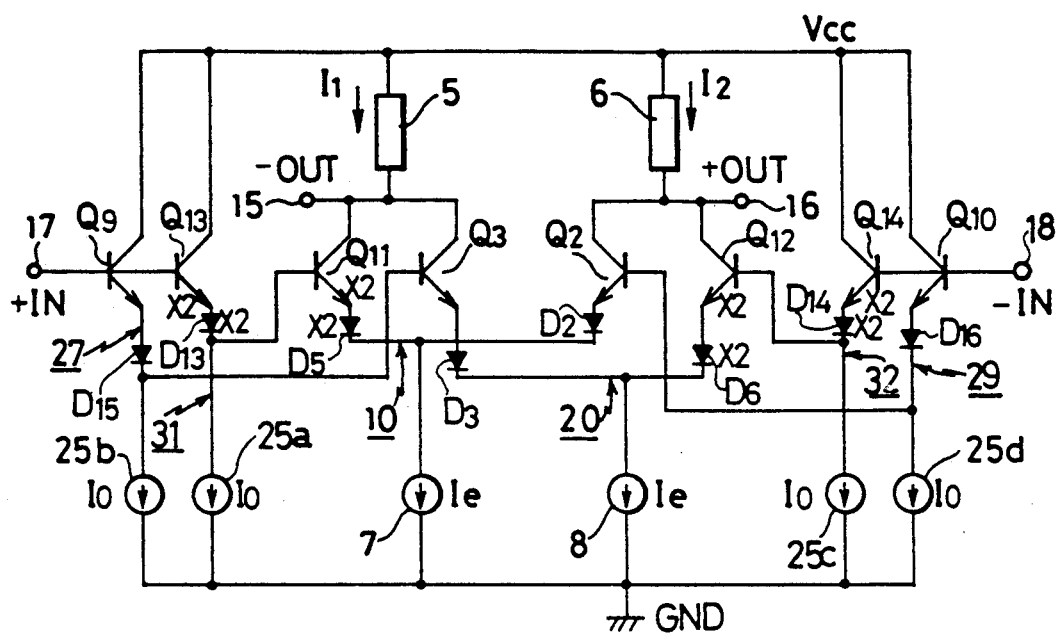
FIG. 19 is a circuit diagram of the fifteenth embodiment of a linear differential amplifier according to the present invention.

Referring now to FIG. 19, there is shown a fifteenth embodiment of a linear differential amplifier according to the present invention. In this embodiment, the linear differential amplifier of FIG. 15 is further modified by changing the pairs of emitter-followers 27 and 39, and 29 and 40 to the pairs of emitter-followers 27 and 31, and 29 and 32, such that the transistors of the paired emitter-followers $Q_9$ and $Q_{13}$, $Q_{10}$ and $Q_{14}$ have an emitter area ratio of 1:2. In addition, in this embodiment, diodes $D_{13}$, $D_{14}$, $D_{15}$, and $D_{16}$ are connected between the emitter of each of the transistors $Q_9$, $Q_{10}$, $Q_{13}$, and $Q_{14}$, respectively, and the constant current sources 25a, 25b, 25c, and 25d, respectively, of which each of the diodes $D_{15}$ and $D_{16}$ is equivalent to the diode $D_1$ while each of the diodes $D_{13}$ and $D_{14}$ is equivalent to two diodes $D_1$ and $D_4$ connected together in series. Again, the use of these diodes $D_{13}$, $D_{14}$, $D_{15}$, and $D_{16}$ connected to the transistors $Q_9$, $Q_{10}$, $Q_{13}$, and $Q_{14}$ of the pairs of the emitter-followers 27 and 31, and 29 and 32 make it possible to improve the linearity without employing transistors of larger emitter areas.

Figure 20:
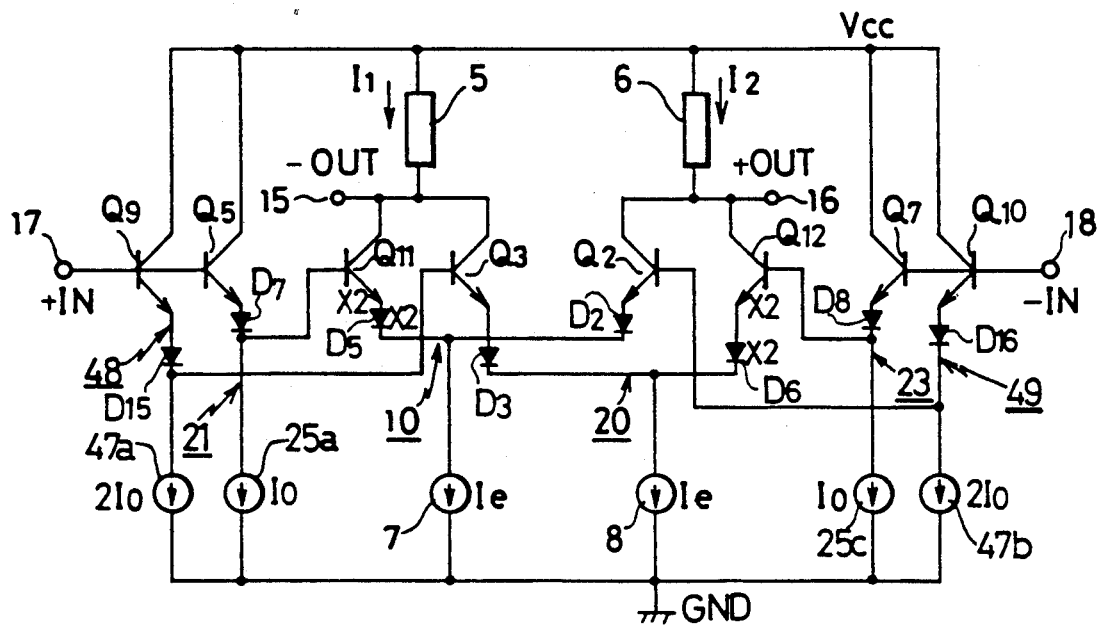
FIG. 20 is a circuit diagram of the sixteenth embodiment of a linear differential amplifier according to the present invention.

Referring now to FIG. 20, there is shown a sixteenth embodiment of a linear differential amplifier according to the present invention. In this embodiment, the linear differential amplifier of FIG. 19 is further modified by changing the emitter-followers 31 and 32 to emitter-followers 48 and 49, such that the transistors of the paired emitter-followers $Q_5$ and $Q_9$, $Q_7$ and $Q_{10}$ have the same emitter areas, and at the same time by connecting the transistors $Q_9$ and $Q_{10}$ to the emitter current sources 47a and 47b, respectively, which supply emitter currents $2I_o$ which is four times greater than that supplied by the emitter current sources 25a and 25c to the transistors $Q_5$ and $Q_7$, and also by replacing the diodes $D_{13}$ and $D_{14}$ by diodes $D_7$ and $D_8$, each of which is equivalent to the diodes $D_1$. Again, the use of these diodes $D_7$, $D_8$, $D_{15}$, and $D_{16}$ connected to the transistors $Q_5$, $Q_7$, $Q_{25}$, and $Q_{26}$ of the pairs of the emitter-followers 21 and 48, and 23 and 49 make it possible to improve the linearity without employing transistors of larger emitter areas.

It is to be noted that in the ninth to sixteenth embodiments of FIGS. 13–20, any one of the diodes may be replaced by a transistor with its base connected to its collector, just as in the eighth embodiment of FIG. 12 with respect to the seventh embodiment of FIG. 11.

It should readily be understood that the specific ratio such as 1:4 or 1:2 has been used in the preceding descriptions for the sake of definiteness, but they only need to be followed approximately, and practically the same advantages can be obtained with such approximation.

It can also be seen that a linear differential amplifier of the present invention can be utilized not only in an electric filter, but anywhere where the improved linearity of an amplifier is desirable such as, for example, an initial stage for an amplifier of the operational amplifier type.

Furthermore, many modifications and variations of the embodiments explained may be made without departing from the novel and advantageous features of this invention. Accordingly, all such modifications and variations are intended to be included within the scope of the appended claims.

What is claimed is:

1. A linear differential amplifier, comprising:
a pair of first and second transistors with their emitters coupled to each other;
a pair of third and fourth transistors with their emitters coupled to each other, a collector of said first transistor being connected to a collector of said third transistor and a collector of said second transistor being connected to a collector of said fourth transistor;
a pair of input terminals, one of which being coupled to a base of said first transitor, the other one of which being coupled to a base of said fourth transistor;
a pair of output terminals, one of which being connected to said collectors of said first and said third transistor, the other one of which being connected to said collectors of said second and said fourth transistors;
first voltage source means for applying first offset DC voltage between one of said input terminals and a base of said third transistor, said first voltage source means including a first pair of emitter-followers with each said emitter-follower including transistors of same emitter areas but different collector currents, and first emitter current sources for each transistor of said first pair of emitter-followers which supply emitter currents corresponding to the collector currents;
second voltage source means for applying second offset DC voltage of the same magnitude as said first offset DC voltage, between one of said input terminals and a base of said second transistor, said second voltage source means including a second pair of emitter-followers with each said emitter-follower including transistors of same emitter areas but different collector currents, and second emitter current sources for each transistor of said second pair of emitter-followers which supply emitter currents corresponding to the collector currents;
constant current source means for supplying emitter currents to said first, second, third, and fourth transistors; and
load resistor means for converting collector currents of said first, second, third, and fourth transistors into output voltages.

2. A linear differential amplifier, comprising:
a pair of first and second transistors with their emitters coupled to each other;
a pair of third and fourth transistors with their emitters coupled to each other, a collector of said first transistor being connected to a collector of said third transistor and a collector of said second transistor being connected to a collector of said fourth transistor, and said first and fourth transistors having emitter areas different from those of said second and third transistors;
a pair of input terminals, one of which being coupled to a base of said first transistor, the other one of which being coupled to a base of said fourth transistor;
a pair of output terminals, one of which being connected to said collectors of said first and said third transistor, the other one of which being connected to said collectors of said second and said fourth transistors;
first voltage source means for applying first offset DC voltage between one of said input terminals and a base of said third transistor, said first voltage source means including a first pair of emitter-followers with each said emitter-follower including transistors of different emitter areas, and first emitter current sources for supplying constant emitter currents to said transistors of said first pair of emitter-followers;
second voltage source means for applying second offset DC voltage of the same magnitude as said first offset DC voltage, between one of said input terminals and a base of said second transistor, said second voltage source means including a second pair of emitter-followers with each said emitter-follower including transistors of different emitter areas, and second emitter current sources for supplying constant emitter currents to said transistors of said second pair of emitter-followers;
constant current source means for supplying emitter currents to said first, second, third, and fourth transistors; and
load resistor means for converting collector currents of said first, second, third, and fourth transistors into output voltages.

3. A linear differential amplifier, comprising:
a pair of first and second transistors with their emitters coupled to each other;
a pair of third and fourth transistors with their emitters coupled to each other, a collector of said first transistor being connected to a collector of said third transistor and a collector of said second transistor being connected to a collector of said fourth transistor, and said first and fourth transistors having emitter areas different from those of said second and third transistors;
a pair of input terminals, one of which being coupled to a base of said first transistor, the other one of which being coupled to a base of said fourth transistor;
a pair of output terminals, one of which being connected to said collectors of said first and said third transistor, the other one of which being connected to said collectors of said second and said fourth transistors;
first voltage source means for applying first offset DC voltage between one of said input terminals and a base of said third transistor, said first voltage source means including a first pair of emitter-followers with each said emitter-follower including transistors of same emitter areas but different collector currents, and first emitter current sources for each transistor of said first pair of emitter-followers which supply emitter currents corresponding to the collector currents;
second voltage source means for applying second offset DC voltage of the same magnitude as said first offset DC voltage, between one of said input terminals and a base of said second transistor, said second voltage source means including a second pair of emitter-followers with each said emitter-follower including transistors of same emitter areas but different collector currents, and second emitter current sources for each transistor of said second pair of emitter-followers which supply emitter currents corresponding to the collector currents;

constant current source means for supplying emitter currents to said first, second, third, and fourth transistors; and load resistor means for converting collector currents of said first, second, third, and fourth transistors into output voltages.

4. A linear differential amplifier, comprising:

a pair of first and second transistors with their emitters coupled to each other, each of which having a diode connected to its emitter;

a pair of third and fourth transistors with their emitters coupled to each other, each of which having a diode connected to its emitter, a collector of said frist transistor being connected to a collector of said third transistor and a collector of said second transistor being connected to a collector of said fourth transistor;

a pair of output terminals, one of which being connected to said collectors of said first and said third transistor, the other one of which being connected to said collectors of said second and said fourth transistors;

a first voltage source means for applying first offset DC voltage between one of said input terminals and a base of said third transistor, said first voltage source means including a first pair of emitter-followers with each said emitter-follower including transistors of different emitter areas, and first emitter current sources for supplying constant emitter currents to said transistors of said first pair of emitter-followers;

a second voltage source means for applying a second offset DC voltage of the same magnitude as said first offset DC voltage, between the other one of said input terminals and a base of said second transistors, said second voltage source means including a second pair of emitter-followers with each of said emitter-followers including transistors of different emitter areas, and second emitter current sources for supplying constant emitter currents to the transistors of said second pair of emitter-followers;

constant current source means for supplying emitter currents to said first, second, third, and fourth transistors; and load resistor means for converting collector currents of said first, second, third, and fourth transistors into output voltages.

5. The amplifier of claim 4, wherein one of the transistors of the first pair of emitter-followers has a number of diodes connected to its emitter while another one of the transistors of the first pair of emitter-followers has a different number of diodes connected to its emitter, and wherein one of the transistors of the second pair of emitter-followers has a number of diodes connected to its emitter while another one of the transitors of the second pair of emitter-followers has a different number of diodes connected to its emitter.

6. A linear differential amplifier, comprising:

a pair of first and second transistors with their emitters coupled to each other, each of which having a diode connected to its emitter;

a pair of third and fourth transistors with their emitters coupled to each other, each of which have a diode connected to its emitter, a collector of said third transistor being connected to a collector of said third transistor and a collector of said second transistor being connected to a collector of said fourth transistor;

a pair of output terminals, one of which being connected to said collectors of said first and said third transistor, the other one of which being connected to said collectors of said second and said fourth transistors;

a first voltage source means for applying first offset DC voltage between one of said input terminals and a base of said third transistor, said first voltage source means including a first pair of emitter-followers with each said emitter-follower including transistors of different emitter areas and different collector currents, and emitter current sources for each transistor of the emitter-followers which supply emitter currents corresponding to the collector currents;

a second voltage source means for applying second offset DC voltage of the same magnitude as said first offset DC voltage, between the other one of said input terminals and a base of said second transistor, said second voltage source means including a second pair of emitter-followers followers with each of said emitter-followers including transistors of different emitter areas and different collector currents, and emitter current sources for each transistor of the emitter-followers which supply emitter currents corresponding to the collector currents;

constant current source means for supplying emitter currents to said first, second, third, and fourth transistors; and load resistor means for converting collector currents of said first, second, third, and fourth transistors into output voltages.

7. The amplifier of claim 6, wherein one of the transistors of the first pair of emitter-followers has a number of diodes connected to its emitter while another one of the transistors of the first pair of emitter-followers has a different number of diodes connected to its emitter, and wherein one of the transistors of the second pair of emitter-followers has a number of diodes connected to its emitter while another one of the transistors of the second pair of emitter-followers has a different number of diodes connected to its emitter.

8. A linear differential amplifier, comprising:

a pair of first and second transistors with their emitters coupled to each other, one of which having a number of diodes connected to its emitter while another one of which having a different number of doides connected to its emitter;

a pair of third and fourth transistors with their emitters coupled to each other, one of which having a number of diodes connected to its emitter while another one of which having a different number of diodes connected to its emitter, a collector of said first transistor being connected to a collector of said third transistor and a collector of said second transistor being connected to a collector of said fourth transistor, and said first and fourth transistors having emitter areas different from that of said second and third transistors;

a pair of input terminals, one of which being coupled to the base of said first transistor, the other one of which being coupled to the base of said fourth transistor;

a pair of output terminals, one of which being connected to the collectors of said first and said third transistors, the other one of which being connected to the collectors of said second and said fourth transistors;

first voltage source means for applying first offset DC voltage between one of said input terminals and a base of said third transistor, said first voltage source means including a first pair of emitter-followers with each of the said emitter-followers including transistors of different emitter areas, and first emitter current sources for supplying constant emitter currents to said transistors of said first pair of emitter-followers;

second voltage source means for applying second offset DC voltage of the same magnitude as said first offset DC voltage, between the other one of said input terminals and a base of said second transistor, said second voltage source means including a second pair of emitter-followers with each of said emitter-followers including transistors of different emitter areas, and second emitter current sources for supplying constant emitter currents to the transistors of said second pair of emitter-followers;

constant current source means for supplying emitter currents to said first, second, third, and fourth transistors; and load resistor means for converting collector currents of said first, second, third, and fourth transistors into output voltages.

9. The amplifier of claim 8, wherein one of the transistors of the first pair of emitter-followers has a number of diodes connected to its emitter while another one of the transistors of the first pair of emitter-followers has a different number of diodes connected to its emitter, and wherein one of the transistors of the second pair of emitter-followers has a number of diodes connected to its emitter while another one of the transistors of the second pair of emitter-followers has a different number of diodes connected to its emitter.

10. A linear differential amplifier, comprising:

a pair of first and second transistors with their emitters coupled to each other, one of which having a number of diodes connected to its emitter while another one of which having a different number of diodes connected to its emitter;

a pair of third and fourth transistors with their emitters coupled to each other, one of which having a number of diodes connected to its emitter while another one of which having a different number of diodes connected to its emitter, a collector of said first transistor being connected to a collector of said third transistor and a collector of said second transistor being connected to a collector of said fourth transistor, and said first and said fourth transistors having emitter areas different from that of said second and said third transistors;

a pair of input terminals, one of which being coupled to the base of said first transistor, the other one of which being coupled to the base of said fourth transistor;

a pair of output terminals one of which being connected to the collectors of said first and said third transistors, the other one of which being connected to the collectors of said second and said fourth transistors;

first voltage source means for applying first offset DC voltage between one of said input terminals and the base of said third transistor, said first voltage source means including a first pair of emitter-followers with each of said emitter-followers including transistors of the same emitter areas but different collector currents, and first emitter current sources for each of said transistors of said first pair of emitter-followers which supply emitter currents corresponding to the collector currents;

second voltage source means for applying second offset DC voltage of the same magnitude as said first offset DC voltage, between the other one of said input terminals and the base of said second transistor, said second voltage source means including a second pair of emitter-followers with each of said emitter-followers including transistors of the same emitter areas but different collector currents, and second pair of emitter-followers which supply emitter currents corresponding to the collector currents;

constant current source means for supplying emitter currents to said first, second, third, and fourth transistors, and load resistor means for converting collector currents of said first, second, third, and fourth transistors into output voltages.

11. The amplifier of claim 10, wherein each of the transistors of the first pair of emitter-followers has a diode connected to its emitter, and wherein each of the transistors of the second pair of emitter-followers has a diode connected to its emitter.

* * * * *